(12) United States Patent  (10) Patent No.: US 8,614,517 B2
Yasukawa  (45) Date of Patent: Dec. 24, 2013

(54) SEMICONDUCTOR DEVICE AND METHOD OF MANUFACTURING THE SAME

(75) Inventor: Hirohisa Yasukawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/287,701

(22) Filed: Nov. 2, 2011

(65) Prior Publication Data

US 2012/0119372 A1  May 17, 2012

(30) Foreign Application Priority Data

Nov. 11, 2010  (JP) ................................. 2010-252910

(51) Int. Cl.
*H01L 23/29* (2006.01)
(52) U.S. Cl.
USPC .................... 257/790; 438/127; 257/E23.129
(58) Field of Classification Search
USPC .......... 257/789, 790, 791, 792, 793, E23.119, 257/E23.12, E23.129, 778; 438/127
See application file for complete search history.

(56) References Cited

U.S. PATENT DOCUMENTS

| 5,272,377 A * | 12/1993 | Shimozawa et al. | 257/787 |
| 6,214,446 B1 * | 4/2001 | Funada et al. | 428/212 |
| 2007/0278667 A1 * | 12/2007 | Kusano et al. | 257/712 |

FOREIGN PATENT DOCUMENTS

JP  2007-335740  12/2007

* cited by examiner

*Primary Examiner* — Amar Movva
(74) *Attorney, Agent, or Firm* — Dentons US LLP (57) ABSTRACT

A semiconductor device includes: a substrate including an electrode pad on a surface; a semiconductor chip placed on the substrate so as to be electrically connected to the electrode pad; a first resin layer which is formed on the substrate and is also filled between the substrate and the semiconductor chip; and a second resin layer, laminated on the first resin layer, which has an elastic modulus larger than that of the first resin layer.

3 Claims, 7 Drawing Sheets

SEMICONDUCTOR DEVICE AND METHOD OF MANUFACTURING THE SAME

BACKGROUND

The present disclosure relates to a semiconductor device and a method of manufacturing the same.

In recent years, miniaturization, high functionality and speeding up of electronic devices such as computers, cellular phones, and PDAs (Personal Digital Assistances) have progressed. Therewith, miniaturization, speeding up, and high density of semiconductor devices such as ICs (integrated circuits) and LSIs (large-scale integrated circuits) for such electronic devices are necessary.

Miniaturization, speeding up and high density of semiconductor devices have a tendency to cause an increase in power consumption, and to increase the amount of heat generation per unit volume.

In the past, as mounting structures of a semiconductor chip, structures have been used in which a semiconductor chip is mounted on a substrate in a flip-chip manner using a solder bump, in the state where the surface on which an electrode of the semiconductor chip is formed is faced down.

In the semiconductor device in which flip-chip mounting is performed, there is a problem that stress is generated in the junction portion through the solder bump by the heat generation due to a difference in the coefficients of thermal expansion between a semiconductor chip and a substrate, and the connection reliability is deteriorated.

Similarly, when the amount of warpage of the semiconductor device in which the semiconductor chip is mounted in a flip-chip manner is large, there is a problem that the secondary mounting reliability at the time of mounting the semiconductor device on a mounting substrate is deteriorated.

In order to solve such problems, a semiconductor device is proposed in which a gap between a semiconductor chip and a substrate is filled with an underfill and is hardened, and a portion of the substrate is covered with a resin layer (see, for example, Japanese Unexamined Patent Application Publication No. 2007-335740).

Figure 7A:
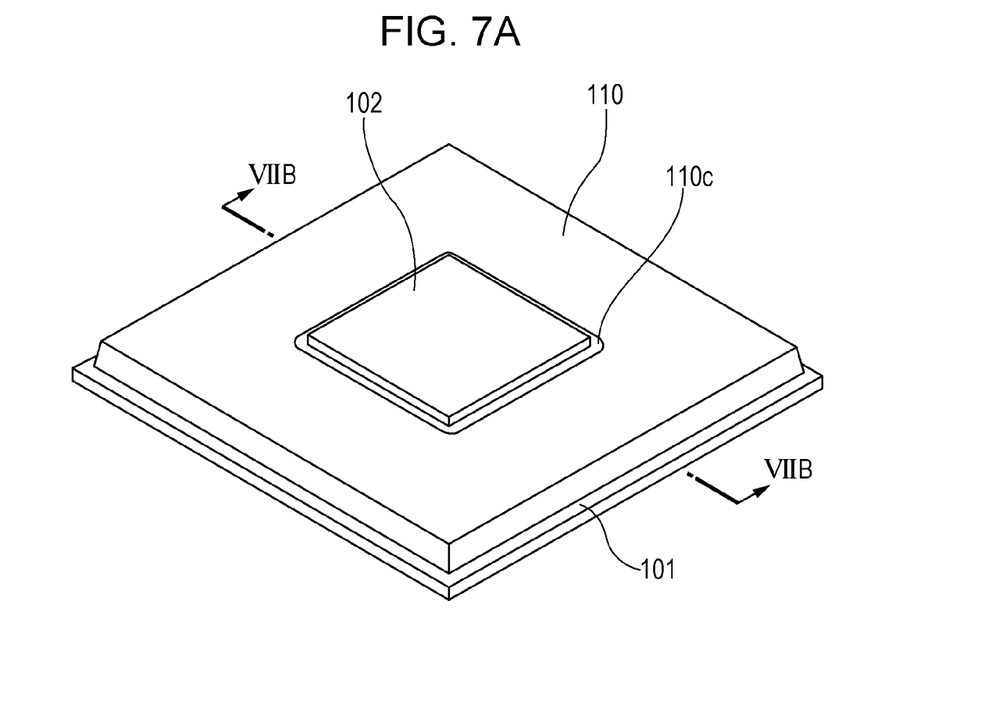
FIGS. 7A and 7B are schematic configuration diagrams illustrating a semiconductor device proposed in the related art.
Figure 7B:
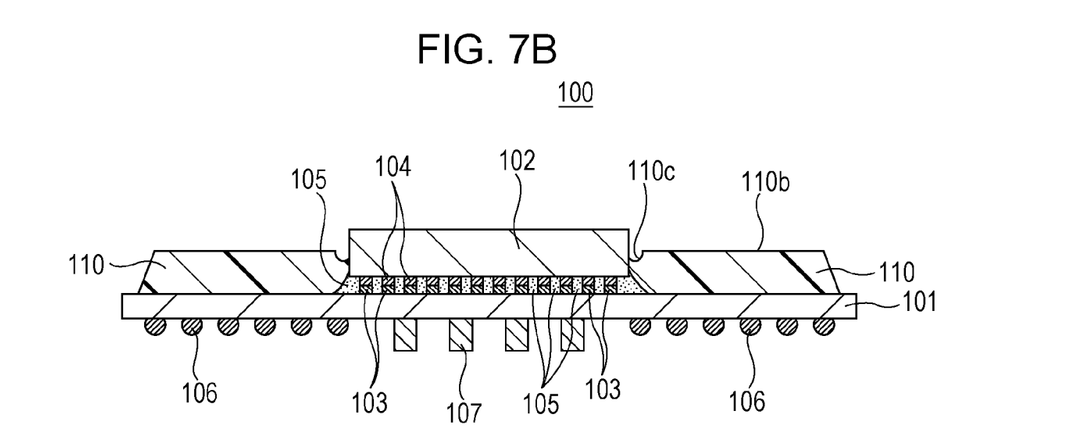

That is, for example, a gap between a substrate 101 and a semiconductor chip 102 located thereon is filled with an underfill 105, as shown in FIG. 7A illustrating a perspective view of the semiconductor device and FIG. 7B illustrating a cross-sectional view taken along the line VIIB-VIIB of FIG. 7A.

The substrate 101 and the semiconductor chip 102 are electrically connected to each other by electrode pads 103 on the surface (upper surface in the drawing) of the substrate 101 and solder bumps 104 on the lower surface of the semiconductor chip 102. The underfill 105 is filled in the portions other than those in which the electrode pads 103 and the solder bumps 104 are connected to each other.

A semiconductor device 100 is formed by covering the substrate 101 around the semiconductor chip 102 with a resin layer 110.

In addition, solder balls 106 are formed on the backside (lower surface in the drawing) of the substrate 101.

With such a configuration, since stress applied to the solder bump is relaxed by the underfill and the resin layer on the substrate, the connection reliability is improved. In addition, it is possible to suppress deformation caused by external forces to the substrate.

SUMMARY

However, there may be a case in which air is involved when the underfill intrudes between the semiconductor chip and the substrate, due to the state of the substrate surface or the variation in the amount of underfill applied and the like, to thereby produce a void. When a void exists within the underfill, it is considered that the solder bumps are electrically short-circuited at the time of mounting the semiconductor device on the mounting substrate.

Particularly, with respect to the connection portion of the electrode pad of the substrate and the bump of the semiconductor chip, the number thereof increases or the interval thereof narrows, whereby a void is easily produced within the underfill.

In addition, it is also considered that depending on selection of materials of the underfill and the sealing resin layer, the stress of the solder bump increases, and the deterioration in the connection reliability of the solder bump or the amount of warpage of the semiconductor device increases, to thereby deteriorate the secondary mounting reliability of the semiconductor device on the mounting substrate.

It is desirable to provide a semiconductor device and a method of manufacturing the same which are capable of realizing sufficient connection reliability of the solder bump and the secondary mounting reliability of the semiconductor device on the mounting substrate, without producing a void within the underfill.

According to an embodiment of the present disclosure, there is provided a semiconductor device including: a substrate including an electrode pad on a surface; a semiconductor chip placed on the substrate so as to be electrically connected to the electrode pad; and a first resin layer which is formed on the substrate and is also filled between the substrate and the semiconductor chip.

Further, there is provided a semiconductor device including a second resin layer, laminated on the first resin layer, which has an elastic modulus larger than that of the first resin layer.

According to another embodiment of the present disclosure, there is provided a method of manufacturing a semiconductor device, including: placing a semiconductor chip on a substrate so as to be electrically connected to an electrode pad formed on a surface of the substrate; and forming a first resin layer on the substrate and between the substrate and the semiconductor chip by a transfer molding method.

Further, there is provided a semiconductor device including forming a second resin layer, laminated on the first resin layer, which has an elastic modulus larger than that of the first resin layer, by a transfer molding method.

According to the above-mentioned configuration of the semiconductor device of the embodiment of the present disclosure, the first resin layer formed on the substrate is also filled between the substrate and the semiconductor chip by a transfer molding method. Thereby, since the underfill is not used between the substrate and the semiconductor chip, there is no case in which air is involved when the underfill intrudes between the semiconductor chip and the substrate, due to the state of the substrate surface or the variation in the amount of underfill applied and the like, to thereby produce a void.

In addition, the second resin layer having an elastic modulus larger than that of the first resin layer is laminated on the first resin layer. Thereby, it is possible to reduce the stress generated in the connection portion between the substrate and the semiconductor chip by the first resin layer having a smaller elastic modulus, and to reduce the amount of warpage of the semiconductor device by the second resin layer having a larger elastic modulus.

According to the above-mentioned method of manufacturing a semiconductor device of the embodiment of the present disclosure, the first resin layer is formed on the substrate and between the substrate and the semiconductor chip, and the second resin layer, laminated on the first resin layer, which has an elastic modulus larger than that of the first resin layer is formed.

Thereby, as mentioned above, it is possible to reduce stress generated in the connection portion between the substrate and the semiconductor chip without producing a void between the substrate and the semiconductor chip, and to manufacture a semiconductor device capable of reducing the amount of warpage of the semiconductor device.

According to the above-mentioned embodiments of the present disclosure, it is possible to reduce stress generated in the connection portion between the substrate and the semiconductor chip without producing a void between the substrate and the semiconductor chip, and to reduce the amount of warpage of the semiconductor device.

Therefore, according to the embodiments of the present disclosure, it is possible to improve the connection reliability of the connection portion between the semiconductor chip and the substrate and the secondary mounting reliability on the substrate.

DETAILED DESCRIPTION OF EMBODIMENTS

Hereinafter, the best mode for carrying out the present disclosure (hereinafter, referred to as the embodiment) will be described.

Meanwhile, description will be performed in the following order.
1. First Embodiment
2. Second Embodiment
3. Modified Example
4. Simulation
<1. First Embodiment>

Figure 1:
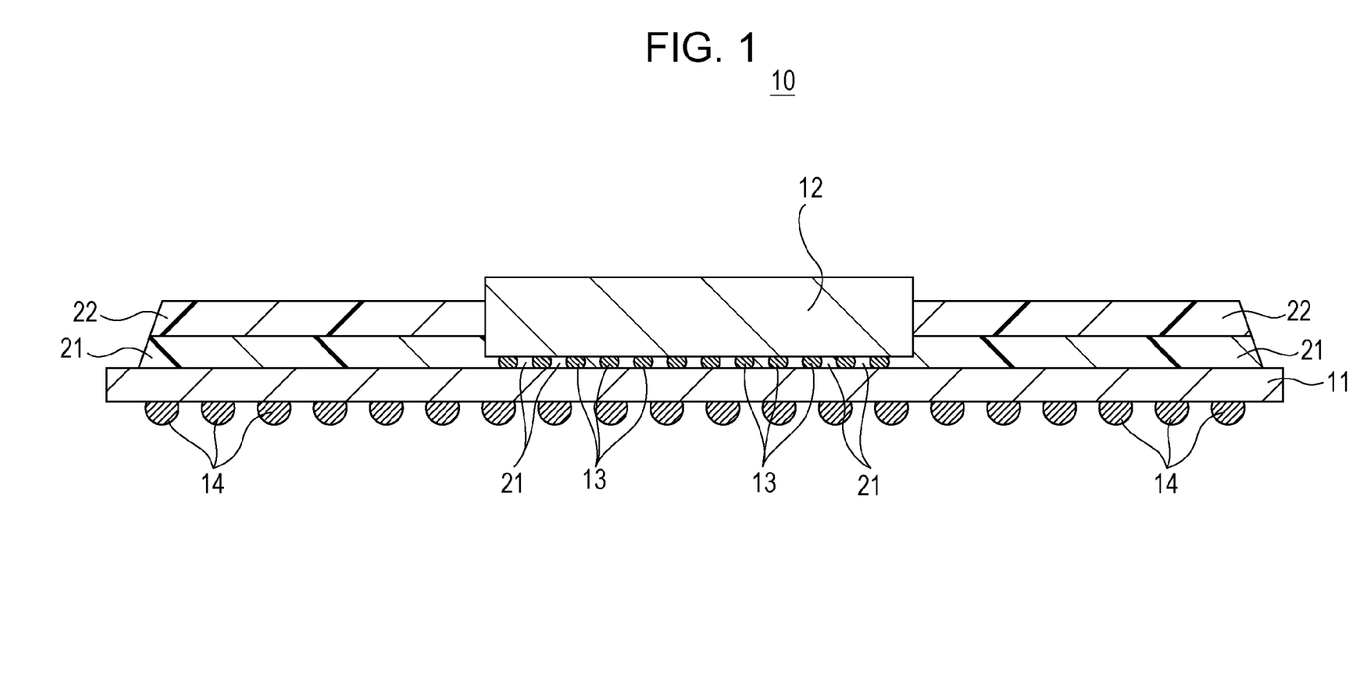
FIG. 1 is a schematic configuration diagram (cross-sectional view) illustrating a semiconductor device according to a first embodiment of the present disclosure.

FIG. 1 shows a schematic configuration diagram (cross-sectional view) illustrating a semiconductor device according to a first embodiment of the present disclosure.

In a semiconductor device 10, a semiconductor chip 12 is provided on a substrate 11.

An electrode pad (not shown) is formed on the upper surface of the substrate 11, and solder bumps 13 formed on the lower surface of the semiconductor chip 12 are connected to the electrode pad, whereby the electrode pad of the substrate 11 and the semiconductor chip 12 are electrically connected to each other.

In addition, solder balls 14 are provided on the lower surface of the substrate 11.

In the semiconductor device 10 of the embodiment, particularly, a resin layer formed on the substrate 11 has a configuration in which a first resin layer (lower layer) 21 and a second resin layer (upper layer) 22 are laminated. Further, the first resin layer 21 is filled in a gap between the substrate 11 and the semiconductor chip 12 by a transfer molding method.

Thereby, since an underfill is not used between the substrate 11 and the semiconductor chip 12, there is no case in which air is involved when the underfill intrudes between the semiconductor chip and the substrate, due to the state of the substrate surface or the variation in the amount of underfill applied and the like, to thereby produce a void.

The second resin layer (upper layer) 22 is configured to have an elastic modulus larger than that of the first resin layer (lower layer) 21.

Thereby, it is possible to reduce stress generated in the solder bump 13 by the first resin layer 21 having a smaller elastic modulus. In addition, it is possible to reduce the amount of warpage of the semiconductor device 10 by the second resin layer 22 having a large elastic modulus.

The thickness of the first resin layer 21 becomes larger than the height from the surface of the substrate 11 to the lower surface of the semiconductor chip 12, and only the first resin layer 21 is filled in a gap between the substrate 11 and the semiconductor chip 12.

The second resin layer 22 is formed outside the semiconductor chip 12.

The upper surface of the second resin layer 22 is located below the upper surface of the semiconductor chip 12, and the upper surface of the semiconductor chip 12 is exposed.

In such a configuration, the heat is more easily dissipated from the upper surface of the semiconductor chip 12 than in the configuration in which the upper surface of the semiconductor chip 12 is covered with the second resin layer 22.

A resin used as a sealing resin from the related art can be used in the first resin layer 21 and the second resin layer 22. For example, the resin includes thermosetting resins such as an epoxy resin.

In order to change the elastic modulus in the epoxy resin, for example, the chemical structure or the molecular weight of the base epoxy resin, or the particle diameter or the content rate of a filler (carbon or silica and the like) contained in the resin may be changed.

The first resin layer 21 and the second resin layer 22 preferably have an elastic modulus larger than that of an underfill used in the related art.

The first resin layer 21 and the second resin layer 22 are preferably formed by a transfer molding method.

Thereby, in the first resin layer 21 filled in the gap between the substrate 11 and the semiconductor chip 12, since the production of a void can be suppressed, the solder bumps are electrically short-circuited at the time of mounting the semiconductor device 10 on a mounting substrate.

In the embodiment, the configuration of the semiconductor chip 12 is not particularly limited, and various types of semiconductor chips can be used.

For example, it is possible to use semiconductor chips such as a CPU (central processing unit), a MPU (Micro Processing Unit), and an ASIC (Application Specific Integrated Circuit).

In the embodiment, the configuration of the substrate 11 is not particularly limited.

Particularly, in the case of a coreless substrate which does not contain a core material, since the substrate 11 is soft and is easily warped, it is effective to reinforce the substrate 11 and suppress the warpage thereof by forming the first resin layer 21 and the second resin layer 22 on the substrate 11.

The semiconductor device 10 of the embodiment can be manufactured, for example, as described below.

Figure 2:
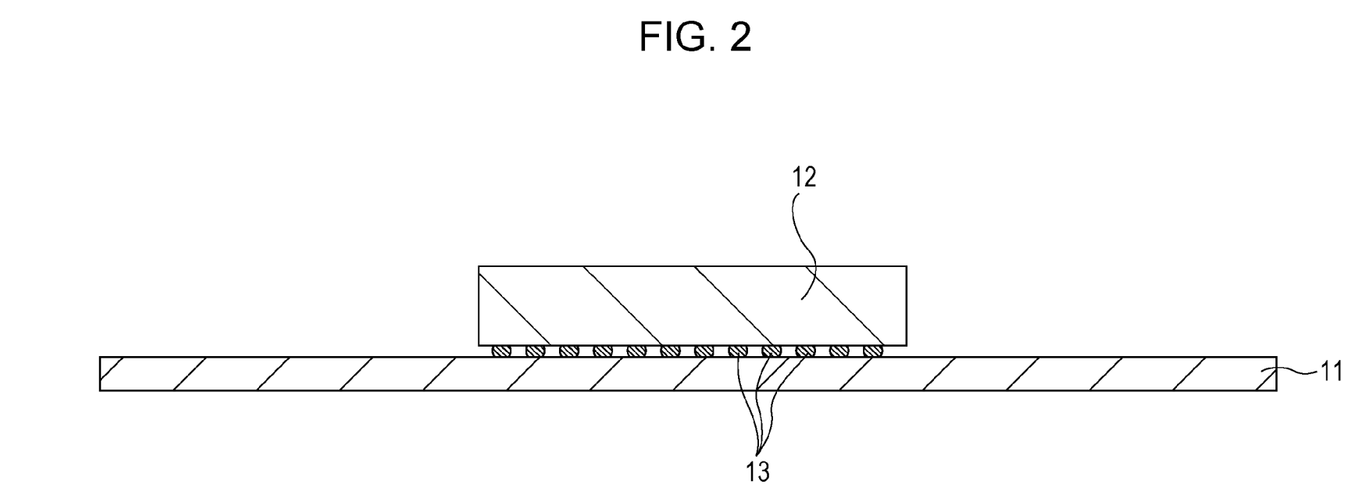
FIG. 2 is a manufacturing process diagram illustrating a method of manufacturing the semiconductor device of FIG. 1.

First, as shown in FIG. 2, the solder bump 13 located on the lower surface of the semiconductor chip 12 is connected to the electrode pad located on the surface of the substrate 11, and the semiconductor chip 12 is mounted on the substrate 11.

Figure 3:
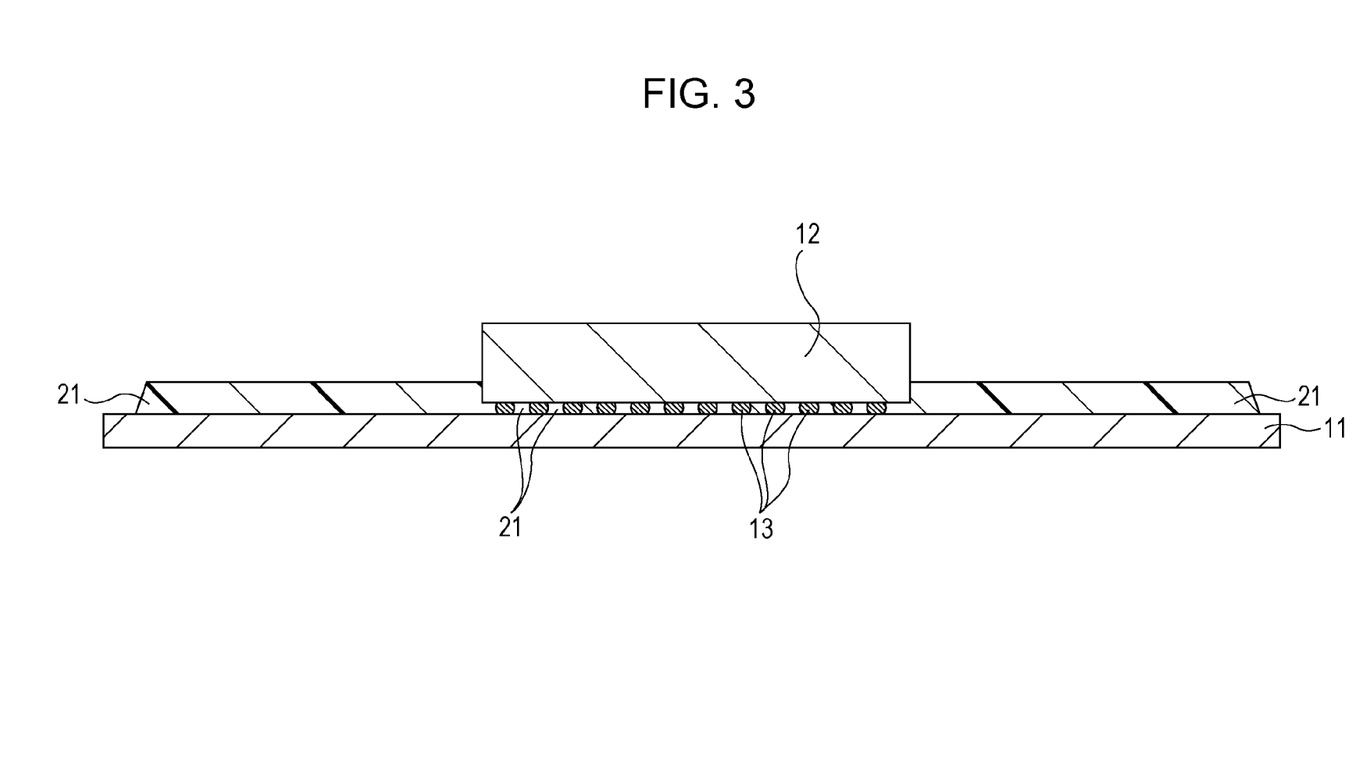
FIG. 3 is a manufacturing process diagram illustrating the method of manufacturing the semiconductor device of FIG. 1.

Next, as shown in FIG. 3, the first resin layer 21 is formed on the substrate 11 by a transfer molding method, and the first resin layer 21 is filled between the substrate 11 and the semiconductor chip 12. At this time, the thickness of the first resin layer 21 is set to the height or greater from the substrate 11 to the lower surface of the semiconductor chip 12.

Figure 4:
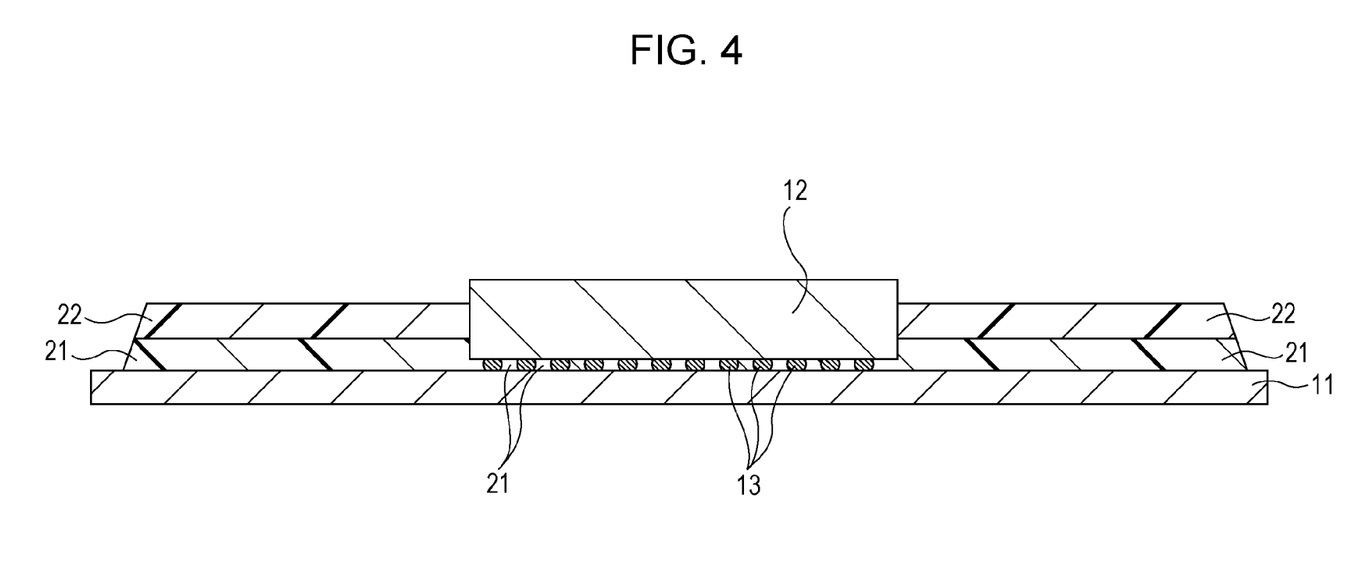
FIG. 4 is a manufacturing process diagram illustrating the method of manufacturing the semiconductor device of FIG. 1.

Subsequently, as shown in FIG. 4, the second resin layer 22 is formed on the first resin layer 21 around the semiconductor chip 12 by a transfer molding method.

At this time, it is preferable that the upper surface of the second resin layer 22 is caused to be located below the upper surface of the semiconductor chip 12, to thereby expose the upper surface of the semiconductor chip 12.

Thereafter, the solder ball 14 is formed on the backside of the substrate 11.

In this manner, it is possible to manufacture the semiconductor device 10 as shown in FIG. 1.

According to the configuration of the semiconductor device 10 of the above-mentioned embodiment, the first resin layer (lower layer) 21 and the second resin layer (upper layer) 22 are laminated on the substrate 11, and the first resin layer 21 is filled in the gap between the substrate 11 and the semiconductor chip 12. The second resin layer (upper layer) 22 is configured to have an elastic modulus larger than that of the first resin layer (lower layer) 21.

Thereby, since an underfill is not used between the substrate 11 and the semiconductor chip 12, there is no case in which air is involved when the underfill intrudes between the semiconductor chip and the substrate, due to the roughness state of the substrate surface or the variation in the amount of underfill applied and the like, to thereby produce a void.

In addition, it is possible to reduce stress generated in the solder bump 13 by the first resin layer 21 having a smaller elastic modulus, and to reduce the amount of warpage of the semiconductor device 10 by the second resin layer 22 having a larger elastic modulus.

In this manner, it is possible to reduce stress generated in the solder bump 13 without producing a void within the underfill, and to reduce the amount of warpage of the semiconductor device 10. Thereby, it is possible to improve the connection reliability of the solder bump 13 and the secondary mounting reliability on the substrate 11.

<2. Second Embodiment>

Figure 5:
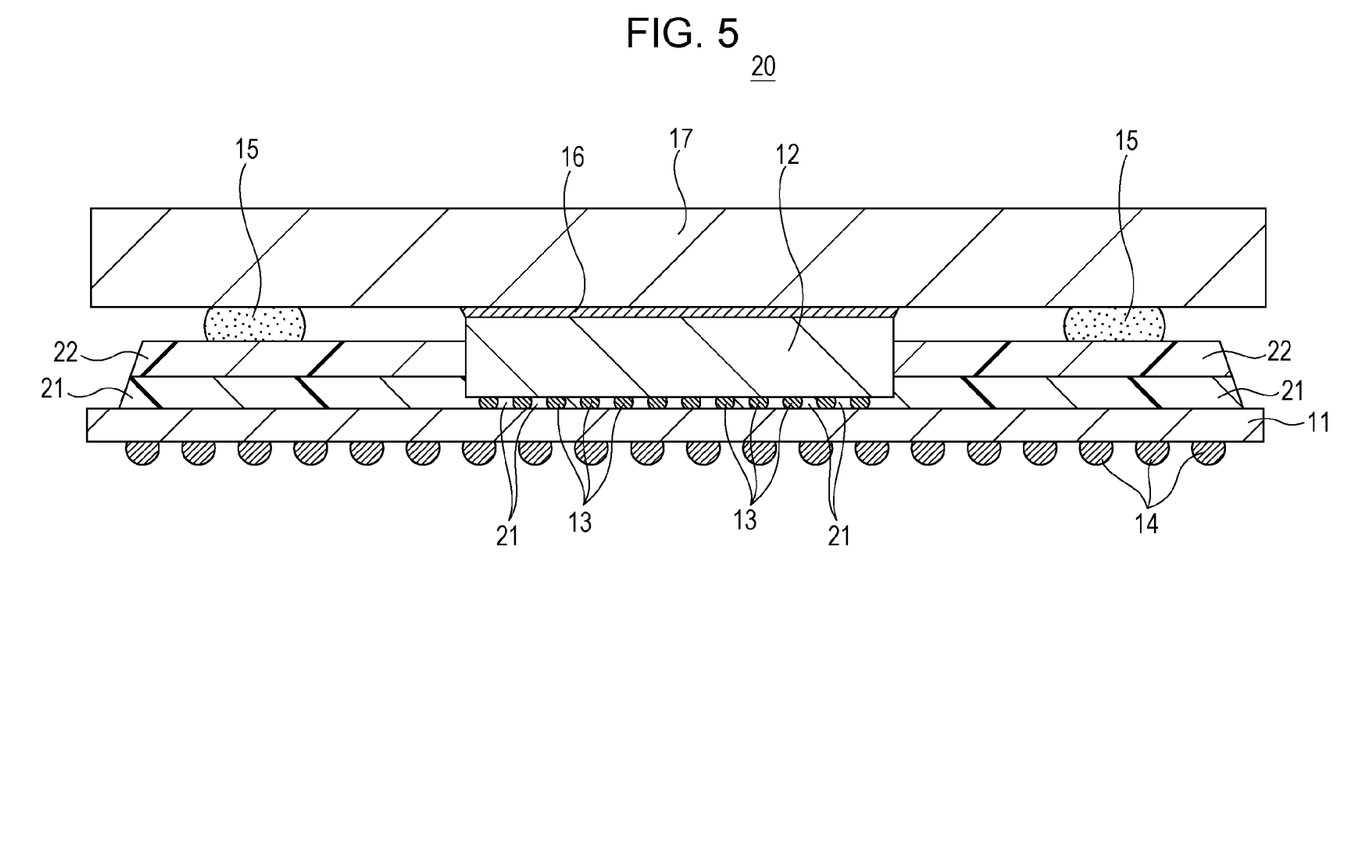
FIG. 5 is a schematic configuration diagram (cross-sectional view) illustrating the semiconductor device according to a second embodiment of the present disclosure.

FIG. 5 shows a schematic configuration diagram (cross-sectional view) illustrating the semiconductor device according to a second embodiment of the present disclosure.

In a semiconductor device 20, a cooling member 17 for cooling the semiconductor chip 12 is provided on the semiconductor chip 12 which is connected onto the substrate 11.

The cooling member 17 and the second resin layer 22 around the semiconductor chip 12 are connected to each other by an adhesive 15.

In addition, the cooling member 17 and the upper surface of the semiconductor chip 12 are connected to each other by a thermal interface material layer 16.

As the cooling member 17, various types of cooling members employed in the related art can be used.

For example, the cooling member includes a metallic heat sink, a water-cooled heat sink, a Peltier element, and the like.

Materials used in the thermal interface material layer 16 include any one of resins of an epoxy resin, a silicone resin, a polyimide resin, a polyolefin-based resin, a cyanate ester-based resin, a phenol resin, and a naphthalene-based resin, as a main component, and includes materials containing elements such as Ag, Pd, Cu, Al, Au, Mo, and W, or ceramic materials such as diamond, alumina, AlN, mullite, BN, and SiC, in the main component.

Other configurations are the same as those of the semiconductor device 10 of the first embodiment, and thus the description thereof will be not repeated.

According to the configuration of the semiconductor device 20 of the above-mentioned embodiment, similarly to the semiconductor device 10 of the first embodiment, the first resin layer (lower layer) 21 and the second resin layer (upper layer) 22 are laminated, and the first resin layer 21 is filled in the gap between the substrate 11 and the semiconductor chip 12. The second resin layer (upper layer) 22 is configured to have an elastic modulus larger than that of the first resin layer (lower layer) 21.

Thereby, since an underfill is not used between the substrate 11 and the semiconductor chip 12, there is no case in which air is involved when the underfill intrudes between the semiconductor chip and the substrate, due to the roughness state of the substrate surface or the variation in the amount of underfill applied and the like, to thereby produce a void.

In addition, it is possible to reduce stress generated in the solder bump 13 by the first resin layer 21 having a smaller elastic modulus, and to reduce the amount of warpage of the semiconductor device 10 by the second resin layer 22 having a larger elastic modulus.

Therefore, it is possible to improve the connection reliability of the solder bump 13 and the secondary mounting reliability on the substrate 11.

In addition, according to the configuration of the semiconductor device 20 of the embodiment, the upper surface of the semiconductor chip 12 is not covered with the second resin layer 22, and is connected to the cooling member 17 through the thermal interface material layer 16.

Thereby, it is possible to efficiently cool the heat of the semiconductor chip 12 using the cooling member 17.

<3. Modified Example>

In each of the embodiments described above, only the first resin layer 21 and the second resin layer 22 are formed on the portion of the substrate 11 located outside the semiconductor chip 12.

On the other hand, passive elements such as a capacitor or a register may be further provided on the portion of the substrate 11 located outside the semiconductor chip 12, and the passive elements may be covered with the first resin layer 21 and the second resin layer.

According to the semiconductor device of the modified example of the present disclosure, since the amount of warpage of the semiconductor device can be reduced, it is also possible to improve the mounting reliability of these passive elements, and to secure the sufficient mounting reliability even when a coreless substrate is used.

In the second embodiment as shown in FIG. 5, the cooling member 17 is connected onto the semiconductor chip 12 through the thermal interface material layer 16.

In the present disclosure, the configuration in the case where the cooling member is provided is not limited to the configuration as shown in FIG. 5, but may also have other configurations. For example, it may also have a configuration in which a heat sink is connected onto the semiconductor chip through a heat spreader. Since the size of the cooling member is preferably such that the cooling member can cool the entire surface of the semiconductor chip, it is preferably approximately the same size as or greater than that of the upper surface of the semiconductor chip. The shape of the cooling member may be one in which a protruding portion such as a fin is provided, in addition to the plate shape shown in FIG. 5.

In each of the embodiments described above, the substrate 11 and the semiconductor chip 12 are connected to each other in a flip-chip manner using the solder bump 13. However, in the present disclosure, the connection of the substrate and the semiconductor chip may also be performed using other configurations.

For example, it is also possible to use an Au—Au stud bump or Au-solder connection, or to use connection methods other than the flip-chip connection.

As long as a configuration is used in which a first resin layer can be filled, at least, between the substrate and the semiconductor chip, the present disclosure can be applied thereto.

<4. Simulation>

The characteristics of the configuration of the semiconductor device according to the embodiments of the present disclosure and the configuration of the semiconductor device in the related art were compared with each other using a simulation.

A simulation was performed using a model in which the semiconductor chip was connected onto the substrate, and passive elements such as a capacitor were connected to a portion of the substrate located outside the semiconductor chip by employing the first resin (underfill, in the case of the configuration in the related art) between the substrate and the semiconductor chip.

The stress generated in the solder bump connected to the substrate and the amount of warpage of the entire semiconductor device were respectively found by performing the simulation.

The characteristics of the first resin, the second resin, and the underfill were set as shown in Table 1.

The elastic modulus of the first resin at the glass transition temperature Tg or lower was set, as shown in Table 2, in terms of five examples in which the value was changed.

TABLE 1

|  | Coefficient of linear expansion [PPM/° C.] | | Elastic modulus [kgf/mm$^2$] | | Tg |
| --- | --- | --- | --- | --- | --- |
|  | α1 | α2 | <Tg | Tg< | [° C.] |
| First resin layer | 12 | 42 | Variable | 50 | 130 |
| Second resin layer | 12 | 42 | 2,500 | 50 | 130 |
| Underfill | 38 | 135 | 662 | 66 | 120 |

TABLE 2

|  | Elastic modulus [kgf/mm$^2$] | |
| --- | --- | --- |
|  | First resin layer | Second resin layer |
| Example 1 | 3,500 | 2,500 |
| Example 2 | 2,500 | 2,500 |
| Example 3 | 1,500 | 2,500 |
| Example 4 | 500 | 2,500 |
| Example 5 | 10 | 2,500 |

Figure 6:
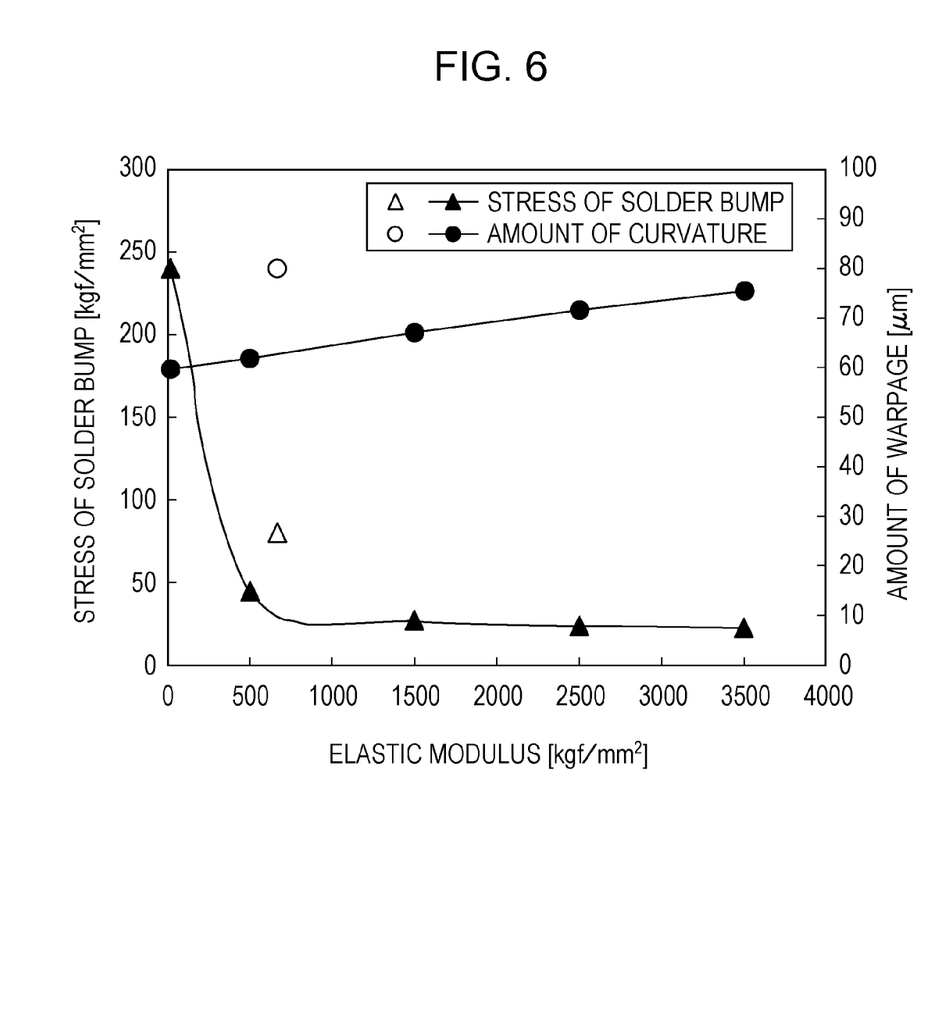
FIG. 6 is a diagram illustrating a result of a simulation.

As a result of performing the simulation, the relationship between the elastic modulus of the first resin, and the stress and the amount of warpage of the solder bump are shown in FIG. 6.

With respect to the configuration of the semiconductor device in the related art, the stress generated in the solder bump is denoted by the white triangle, and the amount of warpage is denoted by the white circle.

With respect to the configuration of the semiconductor device according to the embodiments of the present disclosure, the stress generated in the solder bump is denoted by the black triangle, and the amount of warpage is denoted by the black circle.

From the result shown in FIG. 6, it can be seen that the stress and the amount of warpage generated in the solder bump of the semiconductor device according to the embodiments of the present disclosure are smaller than those of the semiconductor device in the related art, and the reliability is improved.

In addition, when the elastic modulus of the first resin is larger than the elastic modulus of the second resin, it can be seen that the improvement effect in the amount of warpage decreases.

Further, in such conditions, it can be seen that when the elastic modulus of the first resin is set to 500 kgf/mm$^2$ or greater, it is possible to sufficiently reduce the stress applied to the solder bump.

In view of the amount of warpage, the range of the elastic modulus of the first resin capable of sufficiently reducing both the stress and the amount of warpage is thought to be approximately 800 to 1,500 kgf/mm$^2$.

The present disclosure is not limited to the above-mentioned embodiments, but can take other various types of configurations without departing from the scope of the present disclosure.

The present disclosure contains subject matter related to that disclosed in Japanese Priority Patent Application JP 2010-252910 filed in the Japan Patent Office on Nov. 11, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising: a substrate including an electrode pad on a surface of the substrate; a semiconductor chip placed on the substrate so as to be electrically connected to the electrode pad; a first resin layer which is formed on the substrate and is between the substrate and the semiconductor chip such that the semiconductor chip is partially embedded in the first resin layer and there are no voids in the first resin layer between the semiconductor chip and the substrate; and a distinct second resin layer laminated on the first resin layer so as to surround a periphery of the semiconductor chip with a topmost surface of the semiconductor chip protruding above a topmost surface of the second resin layer, the second resin layer having an elastic modulus larger than that of the first resin layer.

2. The semiconductor device according to claim 1, further comprising a cooling member, provided on the semiconductor chip, for dissipating heat of the semiconductor chip, and a thermal interface material layer that thermally connects the cooling member.

3. A method of manufacturing a semiconductor device, comprising: placing a semiconductor chip on a substrate so as to be electrically connected to an electrode pad formed on a surface of the substrate; forming a first resin layer on the substrate and between the substrate and the semiconductor chip by a transfer molding method such that the semiconductor chip is partially embedded in the first resin layer; and forming, by a transfer molding method, a district second resin layer laminated on the first resin layer such that the second resin layer surrounds a periphery of the semiconductor chip with a topmost surface of the semiconductor chip protruding above a topmost surface of the second resin layer, the second resin layer having an elastic modulus larger than that of the first resin layer.

* * * * *